United States Patent
Shimura et al.

(10) Patent No.: US 10,759,890 B2
(45) Date of Patent: Sep. 1, 2020

(54) CURABLE COMPOSITION FOR PRINTED CIRCUIT BOARD, AND CURED COATING FILM AND PRINTED CIRCUIT BOARD INCORPORATING SAME

(71) Applicant: TAIYO INK MFG. CO., LTD., Hiki-gun (JP)

(72) Inventors: Masayuki Shimura, Hiki-gun (JP); Yoshiyuki Furuta, Hiki-gun (JP); Masao Yumoto, Hiki-gun (JP)

(73) Assignee: TAIYO INK MFG. CO., LTD., Hiki-gun (JP)

( * ) Notice: Subject to any disclaimer, the term of this patent is extended or adjusted under 35 U.S.C. 154(b) by 437 days.

(21) Appl. No.: 14/916,344

(22) PCT Filed: Sep. 30, 2014

(86) PCT No.: PCT/JP2014/076101
§ 371 (c)(1),
(2) Date: Mar. 3, 2016

(87) PCT Pub. No.: WO2015/046571
PCT Pub. Date: Apr. 2, 2015

(65) Prior Publication Data
US 2016/0215084 A1 Jul. 28, 2016

(30) Foreign Application Priority Data

Sep. 30, 2013 (JP) ................................ 2013-205343

(51) Int. Cl.
| | | |
|---|---|---|
| *C08F 287/00* | (2006.01) | |
| *C09D 4/06* | (2006.01) | |
| *C08G 18/63* | (2006.01) | |
| *C08F 2/48* | (2006.01) | |
| *H05K 3/28* | (2006.01) | |

(52) U.S. Cl.
CPC .............. *C08F 287/00* (2013.01); *C08F 2/48* (2013.01); *C08G 18/633* (2013.01); *C08G 18/637* (2013.01); *C09D 4/06* (2013.01); *H05K 3/287* (2013.01); *H05K 2203/013* (2013.01)

(58) Field of Classification Search
CPC .................. Y10T 428/24802; H05K 3/287
See application file for complete search history.

(56) References Cited

U.S. PATENT DOCUMENTS

| | | | |
|---|---|---|---|
| 3,960,572 A * | 6/1976 | Ibata .................... | C08G 18/671 |
| | | | 430/281.1 |
| 4,686,171 A | 8/1987 | Fifield et al. | |
| 5,643,657 A * | 7/1997 | Dueber .................... | G03F 7/00 |
| | | | 428/195.1 |
| 5,948,514 A | 9/1999 | Komori et al. | |
| 2007/0134596 A1 | 6/2007 | Lungu | |
| 2009/0038506 A1 | 2/2009 | Odell et al. | |
| 2013/0059411 A1 | 3/2013 | Gerard et al. | |

FOREIGN PATENT DOCUMENTS

| | | | | |
|---|---|---|---|---|
| CN | 1084193 A | | 3/1994 | |
| CN | 1347929 A | | 5/2002 | |
| CN | 101362869 A | | 2/2009 | |
| CN | 102533169 A | | 7/2012 | |
| CN | 102869692 A | | 1/2013 | |
| EP | 0 588 534 A2 | | 3/1994 | |
| JP | 5-75032 B2 | | 10/1993 | |
| JP | 9-54434 A | | 2/1997 | |
| JP | 10-224018 A | | 8/1998 | |
| JP | 2005068280 A | * | 3/2005 | |
| JP | 2012052074 A | * | 3/2012 | |
| WO | WO-2011138630 A1 | * | 11/2011 | ............ C08F 287/00 |
| WO | 2012/132423 A1 | | 10/2012 | |
| WO | 2012/173241 A1 | | 12/2012 | |

OTHER PUBLICATIONS

Machine translation of WO 2012/173241 acquired on Jun. 20, 2018.*
International Search Report dated Jan. 6, 2015 in PCT/JP14/76101 Filed Sep. 30, 2014.
Extended European Search Report dated Feb. 22, 2017 in Patent Application No. 14849338.0.
Combined Office Action and Search Report dated Jan. 26, 2018 in Chinese Patent Application No. 201480054036.6 with English translation, 10 pages.

* cited by examiner

*Primary Examiner* — Gerard Higgins
(74) *Attorney, Agent, or Firm* — Oblon, McClelland, Maier & Neustadt, L.L.P.

(57) ABSTRACT

Provided are: a curable composition that has excellent flexibility and shows excellent adhesion to both a plastic substrate and a conductor layer; a coating film of the curable composition; and a printed circuit board comprising a pattern-cured coating film obtained from the coating film. The present invention relates to: a curable composition for a printed circuit board, which is characterized by comprising (A) a block copolymer, (B) a hydroxyl group-containing (meth)acrylate compound and (C) a photopolymerization initiator; a coating film obtained by photo-curing the curable composition; and a printed circuit board comprising a resist pattern formed from the coating film.

19 Claims, No Drawings

CURABLE COMPOSITION FOR PRINTED CIRCUIT BOARD, AND CURED COATING FILM AND PRINTED CIRCUIT BOARD INCORPORATING SAME

TECHNICAL FIELD

The present invention relates to a curable composition for a printed circuit board. More particularly, the present invention relates to: a UV curable composition to be used in an ink-jet system; a coating film for a printed circuit board, which comprises the composition and forms at least one resist or marking; and a printed circuit board comprising a pattern obtained using the coating film.

BACKGROUND ART

Examples of a composition used in the production of a flexible printed board or tape carrier package include those of (1) a type in which a polyimide film called "cover-lay film" is punched using a mold conforming to a pattern, pasted using a heat-curable adhesive and then cured (for example, Patent Document 1), (2) a type in which a photocurable composition that forms a flexible coating film is coated by screen printing and then cured (for example, Patent Document 2) and (3) a type in which a photocurable/thermosetting resin composition that forms a flexible coating film is coated, exposed, developed and then cured (for example, Patent Document 3). Thereamong, a photocurable composition of the type (2), which requires only to small number of steps for pattern formation and has a short tact time, is preferably used.

RELATED ART DOCUMENTS

Patent Documents

Patent Document 1: Japanese Patent Publication No. H5-75032
Patent Document 2: Japanese Patent No. H10-224018
Patent Document 3: Japanese Unexamined Patent Application Publication No.

SUMMARY OF THE INVENTION

Problems to be Solved by the Invention

It is required that such curable compositions described above maintain various properties such as solder heat resistance and be tightly adhered to both a plastic substrate containing polyimide or the like as a main component and a conductor circuit metal arranged thereon. However, a coating film formed from the conventional photocurable composition disclosed in Patent Document 2 has poor flexibility and it is thus difficult to provide the coating film with excellent adhesiveness with both a conductor circuit metal and a plastic substrate; therefore, an improvement has been desired.

The present invention as made to solve the above-described problems in the prior art and a main object of the present invention is to provide a curable composition for a printed circuit board, which has excellent flexibility and shows excellent adhesion with both a plastic substrate and a conductor circuit metal while maintaining various properties such as solder heat resistance.

Another object of the present invention is to provide: a pattern-cured coating; film which is formed using the curable composition for a printed circuit board and shows satisfactory adhesion with both a plastic substrate and a conductor circuit metal; and a printed circuit board comprising the pattern-cured coating film.

Means for Solving the Problems

It was discovered that the above-described objects of the present invention can be achieved by a curable composition for a printed circuit board, which is characterized by comprising a block copolymer, a hydroxyl group-containing (meth)acrylate compound and a photopolymerization initiator.

That is, the curable composition for a printed circuit board according to the present invention is characterized by comprising: (A) a block copolymer; (B) a hydroxyl group-containing (meth)acrylate compound; and (C) a photopolymerization initiator.

In the curable composition for a printed circuit board according to the present invention, it is preferred that the (A) block copolymer have a weight-average molecular weight (Mw) of 10,000 to 100,000 and a molecular weight distribution (Mw/Mn) of 3 or less.

In the curable composition for a printed circuit hoard according to the present invention, it is preferred that the (A) block copolymer be a block copolymer represented by the following Formula (I):

$$X\text{-}Y\text{-}X \quad (I)$$

(wherein, X represents a polymer unit having a glass transition temperature Tg of 0° C. or higher; and Y represents a polymer unit having a glass transition temperature Tg of lower than 0° C.).

In the curable composition for a printed circuit board according to the present invention, it is preferred that, in the Formula (I), the Y comprise poly-n-butyl(meth)acrylate and the X comprise polymethyl(meth)acrylate.

In the curable composition for a printed circuit board according to the present invention, it is preferred that the (A) block copolymer be liquid at a temperature of 20° C. or higher.

It is preferred that the curable composition for a printed circuit board according to the present invention further comprise a bifunctional (meth)acrylate compound (with no hydroxyl group).

In the curable composition for a printed circuit board according to the present invention, it is preferred that the bifunctional (meth)acrylate compound have a viscosity of 5 to 50 mPa·s at 25° C.

It is preferred that the curable composition for a printed circuit board according to the present invention further comprise a thermosetting component.

It is preferred that the curable composition for a printed circuit board according to the present invention have a viscosity of 5 to 50 mPa·s at 50° C.

The cured coating film of the present invention is characterized in that it is obtained by photoirradiating the above-described curable composition for a printed circuit board.

The printed circuit board of the present invention is characterized by comprising a pattern-cured coating film obtained by printing the above-described curable composition for a printed circuit board on a substrate and subsequently photoirradiating the thus printed curable composition.

Other printed circuit board of the present invention is characterized by comprising a pattern-cured coating film obtained by printing the above-described curable composition for a printed circuit board on a substrate by an ink-jet printing method and subsequently photoirradiating the thus printed curable composition.

In the printed circuit board of the present invention, it is preferred that the substrate be a plastic substrate.

Effects of the Invention

According to the present invention, a cured coating film which has excellent flexibility and shows excellent adhesion to both a plastic substrate and a conductor circuit metal while maintaining various properties such as solder heat resistance can be obtained. Further, the curable composition of the present invention can be suitably used as an ink jet composition.

MODE FOR CARRYING OUT THE INVENTION

The curable composition for a printed circuit board according to the present invention (hereinafter, also referred to as "curable composition") comprises: (A) a block copolymer (componet A); (B) a hydroxyl group-containing (meth)acrylate compound (component B); and (C) a photopolymerization initiator (component C).

The term "(meth)acrylate" used herein is a general term for acrylates, methacrylates and mixtures thereof, and this is hereinafter applicable to all other similar expressions.

[(A) Block Copolymer]

The (A) block copolymer refers to a copolymer having a molecular structure in which two or more polymers having different properties are linked via covalent bonds to form a long chain. By incorporating the (A) block copolymer, the resulting curable resist composition for a printed circuit board is imparted with flexibility and an increased conformability to a substrate, so that good adhesiveness is attained.

The block copolymer used in the present invention is preferably a X-Y-X type or X-Y-X' type block copolymer. Among X-Y-X type and X-Y-X' type block copolymers, ones that are constituted by a middle polymer unit Y, which is a soft block having a low glass transition temperature (Tg) of preferably lower than 0° C. and outer polymer units X or X', which are hard blocks having a high glass transition temperature (Tg) of preferably 0° C. or higher, are preferred. The glass transition temperature (Tg) is measured by differential scanning calorimetry (DSC). Among X-Y-X type and X-Y-X' type block copolymers, ones in which X or X' is a polymer unit having a Tg of 50° C. or higher and Y is a polymer unit having a Tg of −20° C. or lower are also preferred.

Further, among X-Y-X type and X-Y-X' type block copolymers, ones in which X or X' has a Web miscibility with the (B) hydroxyl group-containing (meth)acrylate are preferred, and ones in which Y has a low miscibility with the (B) hydroxyl group-containing (meth)acrylate are also preferred. It is believed that a block copolymer whose blocks of both ends are miscible with a matrix but the middle block is immiscible with the matrix in this manner is likely to exhibit a specific structure in the matrix.

It is preferred to incorporate polymethyl(meth)acrylate (PMMA), polystyrene (PS) or the like as the X or X' and poly-n-butyl acrylate (PBA), polybutadiene (PB) or the like as the Y.

Examples of a commercially available block copolymer include acrylic triblock copolymers produced by living polymerization, which are manufactured by Arkema K.K., such as SBM-type block copolymers represented by poly-styrene-polybutadiene-polymethyl methacrylate, MAM-type block copolymers represented by polymethyl methacrylate-polybutyl acrylate-polymethyl methacrylate and MAM N-type and MAM A-type block copolymers that are subjected to a modification treatment with a carboxylic acid or hydrophilic group. Examples of the SBM-type block copolymers include E41, E40, E21 and E20; examples of the MAM-type block copolymers include M51, M52, M53 and M22; examples of the MAM N-type block copolymers include 52N and 22N; and examples of the MAM A-type block copolymers include SM4032XM10.

In addition, KURARITYs manufactured by Kuraray Co., Ltd. are also block copolymers derived from methyl methacrylate and butyl acrylate, and examples thereof include LA1114, LA2140e, LA2330, LA2250 and LA4285.

As the block copolymer used in the present invention, from the standpoint of attaining the effects of the present invention: a ternary or higher order block copolymer is preferred and a block copolymer which is synthesized by a living polymerization method and has a precisely controlled molecular structure is more preferred. This is thought to be because a block copolymer synthesized by a living polymerization method has a narrow molecular weight distribution and the units thereof each have distinct characteristics. The molecular weight distribution (Mw/Mn) of the block copolymer to be used is preferably 3 or less, more preferably 2.5 or less, still more preferably 2.0 or less.

The above-described block copolymers comprising a (meth)acrylate polymer block can be produced by, for example, a method described in the specification of Japanese Unexamined Patent Application Publication No. 2007-516326 or 2005-515281.

The block copolymer has a weight-average molecular weight in a range of preferably 10,000 to 100,000, more preferably 10,000 to 50,000. When the weight-average molecular weight is 10,000 or greater, the effects of desired toughness and flexibility are attained. Meanwhile, when the weight-average molecular weight is 100,000 or less, deterioration of the printing properties of the composition caused by an increase in the viscosity can be inhibited.

Further, it is preferred that the block copolymer used in the present invention be liquid at a temperature of 25° C. When the block copolymer is liquid, since it can be easily dissolved in the composition, the composition is homogeneous and can thus attain stable properties.

It is preferred that the (A) block copolymer be incorporated in an amount of 1 to 30 parts by mass with respect to 100 parts by mass of the curable composition of the present invention. When the mount is 1 part by mass or greater, the effects of the present invention can be favorably attained, while when the amount is 30 parts by mass or less, the composition has an appropriate viscosity and thus attains good printing properties.

[(B) Hydroxyl Group-Containing (Meth)acrylate Compound]

As the (B)hydroxyl group-containing (meth)acrylate compound, a low-molecular-weight material such as a monomer or an oligomer is used and specifically, a material having a molecular weight in a range of 100 to 1,000, preferably 110 to 700, is used.

Specific examples of the (B) hydroxyl group-containing (meth)acrylate compound include 2-hydroxy-3-acryloy-loxypropyl(meth)acrylate, 2-hydroxy-3-phenoxyethyl (meth)acrylate, 1,4-cyclohexane dimethanol mono(meth) acrylate, 2-hydroxyethyl(meth)acrylate, 2-hydroxypropyl (meth)acrylate, 4-hydroxybutyl(meth)acrylate, pentaerythritol tri(meth)acrylate, dipentaerythritol monohydroxypenta(meth)acrylate and 2-hydroxypropyl(meth)acrylate. Examples of commercial products thereof include ARONIX M-5700 (manufactured by Toagosei Co., Ltd.; trade name); 4HBA, 2HEA and CHDMMA (all of which are manufactured by Nippon Kasei Chemical Co., Ltd.; trade names); BHEA, HPA, HEMA and HPMA (all of which are manufactured by Nippon Shokubai Co., Ltd.; trade names); and LIGHT ESTER HO, LIGHT ESTER HOP and LIGHT ESTER HOA (all of which are manufactured by Kyoeisha Chemical Co., Ltd.; trade names). As the (B) hydroxyl group-containing (meth)acrylate compound, the above-mentioned compounds and products may be used individually, or a plurality thereof may be used in combination.

Thereamong, particularly. 2-hydroxy-3-acryloyloxypropyl acrylate, 2-hydroxy-3-phenoxyethyl acrylate, 2-hydroxyethyl acrylate, 2-hydroxypropyl acrylate, 4-hydroxybutyl acrylate and 1,4-cyclohexane dimethanol monoacrylate can be preferably used. Further, a monofunctional (meth)acrylate compound can also be preferably used because of the easiness of adjusting its viscosity and the like.

The (B) hydroxyl group-containing (meth)acrylate compound is incorporated in an amount of preferably 5 to 50 parts by mass, more preferably 10 to 30 parts by mass, with respect to 100 parts by mass of the curable composition of the present invention. When the amount of the hydroxyl group-containing (meth)acrylate compound is 5 parts by mass or greater, superior adhesiveness, which is a characteristic feature of the composition of the present invention, is attained. Meanwhile, when the amount of the hydroxyl group-containing (meth)acrylate compound is 50 parts by mass or less, a reduction in the ink compatibility can be inhibited.

Because of such a combination of the components (A) and (B), the curable composition of the present invention has excellent adhesiveness to both a plastic substrate and a conductor circuit metal and exhibits excellent substrate protection performance as, for example, a resist ink for a printed circuit board (such as an etching resist ink, a solder resist ink or a plating resist ink). In addition, the curable composition of the present invention also exhibits excellent properties as a cured coating film even when it is cured at a low exposure dose.

[(C) Photopolymerization Initiator]

The (C) photopolymerization initiator is not particularly restricted and, for example, a photo-radical polymerization initiator can be employed. As this photo-radical polymerization initiator, any compound can be used as long as it generates a radical when irradiated with light, laser, electron beam or the like and initiates a radical polymerization reaction.

Examples of the (C) photopolymerization initiator include benzoins and benzoin alkyl ethers, such as benzoin, benzoin methyl ether, benzoin ethyl ether and benzoin isopropyl ether; alkylphenone-based photopolymerization initiators such as 2-hydroxy-2-methyl-1-phenyl-propane-1-one; acetophenones such as acetophenone, 2,2-dimethoxy-2-phenylacetophenone, 2,2-diethoxy-2-phenylacetophenone and 1,1-dichloroacetophenone; aminoacetophenones such as 2-methyl-1-[4-(methylthio)phenyl]-2-morpholinopropane-1-one, 2-benzyl-2-dimethylamino-1-(4-morpholinophenyl)-butane-1-one and N,N-dimethylaminoacetophenone; anthraquinones such as 2-methylanthraquinone, 2-ethylanthraquinone, 2-t-butyl anthraquinone and 1-chloroarithraquinone; thioxanthones such as 2,4-dimethylthioxanthone, 2,4-diethylthioxanthone, 2-chlorothioxanthone and 2,4-diisopropylthioxamhone; ketals such as acetophenone dimethyl ketal and benzyl dimethyl ketal; 2,4,5-triaryl imidazole dimer; riboflavin tetrabutyrate; thiol compounds such as 2-mercaptobenzimidazole, 2-mercaptobenzoxazole and 2-mercaptobenzothiazole; organic halogen compounds such as 2,4,6-tris-s-triazine, 2,2,2-tribromoethanol and tribromomethylphenyl sulfone; benzophenones and xanthones, such as benzophenone and 4,4'-bis-diethylaminobenzophenone; acylphosphine oxide-based photopolymerization initiators such as 2,4,6-trimethylbenzoyldipbenylphosphine oxide and bis(2,4,6-trimethylbenzoyl)-phenylphosphine oxide; and titanocenes such as bis(cyclopentadienyl)-diphenyl-titanium, bis(cyclopentadienyl)-di-chloro-titanium, bis(cyclopentadienyl)-bis(2,3,4,5,6-pentafluorophenyl)titanium and bis(cyclopentadienyl)-bis(2,6-difluoro-3-(pyrrole-1-yl)phenyl)titanium.

These known and commonly used photopolymerization initiators may be used individually, or two or more thereof may be used as a mixture. Further, a photoinitiatoraid, for example, a tertiary amines such as ethyl-N,N-dimethylaminobenzoate, isoamyl-N,N-dimethylaminobenzoate, pentyl-4-dimethylaminobenzoate, triethylamine or triethanolamine, can also be added.

Examples of commercially available photopolymerization initiators include IRGACURE 261, 184, 369, 651, 500, 819, 907, 784 and 2959, DAROCUR 1116, 1173, CGI 1700, CG 11750, CGI 1850 and CG-24-61, and LUCIRIN TPO and CGI-784 (all of which are manufactured by BASF Japan Ltd.; trade names); DAICAT II (manufactured by Daicel Chemical Industries, Ltd.; trade name); RHODORSIL Photoinitiator 2074 (manufactured by Rhodia; trade name); EBECRYL P36 (manufactured by UCB S.A.; trade name); and ESACURE KIP150, KIP65LT, KIP100KT37, KT55, KTO46, KIP75/B and ONE (all of which are manufactured by Fratelli Lamberti S.p.A; trade names).

The ratio of the (C) photopolymerization initiator to be incorporated is preferably in the range of 0.5 to 10 parts by mass with respect to 100 parts by mass of the curable composition of the present invention.

(Bifunctional (Meth)acrylate Compound)

It is preferred that the curable composition for a printed circuit board according to the present invention further comprise a bifunctional (meth)acrylate compound (with no hydroxyl group). By adding a bifunctional (meth)acrylate compound (with no hydroxyl group), the compatibility of the components contained in the curable composition for a printed circuit board can be further improved.

Specific examples of the bifunctional (meth)acrylate compound (with no hydroxyl group) include diol diacrylates such as 1,4-butanediol diacrylate, 1,6-hexanediol diacrylate, 1,9-nonanediol diacrylate and 1,10-decanediol diacrylate; glycol diacrylates, such as ethylene glycol diacrylate, diethylene glycol diacrylate, triethylene glycol diacrylate, tetraethylene glycol diacrylate, polyethylene glycol diacrylate, dipropylene glycol diacrylate, tripropylene glycol diacrylate, polypropylene glycol diacrylate, neopentyl glycol diacrylate, diol diacrylates obtained by adding at least one of ethylene oxide and propylene oxide to neopentyl glycol, and caprolactone-modified hydroxypivalic acid neopentyl glycol diacrylate; diacrylates having a cyclic structure, such as bisphenol A EO-adduct diacrylate, bisphenol A PO-adduct diacrylate, tricyclodecane dimethanol diacrylate, hydrogenated dicyclopentadienyl diacrylate and cyclohexyl diacrylate.

Examples of commercially available bifunctional (meth) acrylate compounds include LIGHT ACRYLATE 1,6HX-A, 1,9ND-A, 3EG-A and 4EG-A (manufactured by Kyoeisha Chemical Co., Ltd.; trade names); HDDA, 1,9-NDA, DPGDA and TPGDA (manufactured by Daicel-Allnex Ltd;

trade names); VISCOAT #195, #230, #230D, #260, #310HP, #335HP and #700HV (manufactured by Osaka Organic Chemical Industry Ltd.; trade names); and ARONIX M-208, M-211B, M-220, M-225, M-240 and M-270 (manufactured by Toagosei Co., Ltd.; trade names).

Thereamong, from the standpoints of the viscosity and the compatibility, diacrylates of dials containing an alkyl chain having 4 to 12 carbon atoms, particularly 1,4-butanediol diacrylate, 1,6-hexanediol diacrylate, 1,9-nonanediol diacrylate and 1,10-decanediol diacrylate are preferred.

The amount of such bifunctional acrylate compound to be incorporated is preferably 20 to 80 parts by mass, more preferably 40 to 70 parts by mass, in 100 parts by mass of the curable composition of the present invention. When the amount of the bifunctional (meth)acrylate is 20 parts by mass or more, the resulting ink has good compatibility. Meanwhile, when the amount is 80 parts by mass or less, the resulting ink has good adhesiveness.

The bifunctional (meth)acrylate compound has a viscosity at 25° C. of preferably 5 to 50 mPa·s, particularly preferably 5 to 30 mPa·s. In this viscosity range, the bifunctional (meth)acrylate compound shows good ease of handling as a diluent and the components can thus be homogeneously mixed. As a result, the entire surface of the resulting coating film can be expected to uniformly adhere to a substrate.

(Thermosetting Component)

A thermosetting component may be added to the curable composition of the present invention. By adding a thermosetting component, the adhesiveness and heat resistance are expected to be improved. Examples of the thermosetting component that can be used in the present invention include amino resins such as melamine resins, benzoguanamine resins, melamine derivatives and benzoguanamine derivatives; block isocyanate compounds; cyclocarbonate compounds; thermosetting components having a cyclic (thio) ether group(s); bismaleimides; and known thermosetting resins such as carbodiimide resins. Block isocyanate compounds are particularly preferred because of their excellent storage stability.

The above-described thermosetting components having a plurality of cyclic (thio)ether groups in one molecule are compounds that contain a plurality of one or two of 3-,4- and 5-membered cyclic (thio)ether groups in one molecule. Examples thereof include compounds having a plurality of epoxy groups in one molecule, namely polyfunctional epoxy compounds; compounds having a plurality of oxetanyl groups in one molecule, namely polyfunctional oxetane compounds; and compounds having a plurality of thioether groups in one molecule, namely episulfide resins.

Examples of the polyfunctional epoxy compounds include, but not limited to, epoxidized vegetable oils such as ADK CIZER O-130P, ADK CIZER O-180A, ADK CIZER D-32 and ADK CIZER D-55, which are manufactured by ADEKA Corporation; bisphenol A-type epoxy resins such as jER828, jER834, jER1001 and jER1004, which are manufactured by Mitsubishi Chemical Corporation, EHPE3150 manufactured by Daicel Chemical Industries, Ltd., EPICLON 840, EPICLON 850, EPICLON 1050 and EPICLON 2055, which are manufactured by DIC Corporation, EPOTOBTO YD-011, YD-013, YD-127 and YD-128, which are manufactured by Tohto Kasei Co., Ltd., D.E.R. 317, D.E.R. 331, D.E.R. 661 and D.E.R. 664, which are manufactured by The Dow Chemical Company, SUMI-EPDXY ESA-011, ESA-014, ELA-115 and ELA-128, which are manufactured by Sumitomo Chemical Co., Ltd., and A.E.R. 330, A.E.R. 331, A.E.R. 661 and A.E.R. 664, which are manufactured by Asahi Chemical Industry Co., Ltd. (all of the above are trade names); a hydroquinone-type epoxy resin YDC-1312, a bisphenol-type epoxy resin YSLV-80XY and to thioether-type epoxy resin YSLV-120TE (all of which are manufactured by Tohtp Kasei Co., Ltd.); brominated epoxy resins such as jERYL 903 manufactured by Mitsubishi Chemical Corporation, EPICLON 152 and EPICLON 165, which are manufactured by DIC Corporation, EPOTOHTO YDB-400 and YDB-500, which are manufactured by Tohto Kasei Co., Ltd., D.E.R. 542 manufactured by The Dow Chemical Company, SUMI-EPDXY ESB-400 and ESB-700, which are manufactured by Sumitomo Chemical Co., Ltd., and A.E.R. 711 and A.E.R. 714, which are manufactured by Asahi Chemical Industry Co., Ltd (all of the above are trade names); novolac-type epoxy resins such as jERI52 and jER154, which are manufactured by Mitsubishi Chemical Corporation, D.E.N. 431 and D.E.N. 438, which are manufactured by The Dow Chemical Company, EPICLON N-730, EPICLON N-770 and EPICLON N-865, which are manufactured by DIC Corporation, EPOTOHTO YDCN-701 and YDCN-704, which are manufactured by Tohto Kasei Co., Ltd., EPPN-201, EOCN-1025, EOCN-1020, EOCN-104S and RE-306, which are manufactured by Nippon Kayaku Co., Ltd., SUMI-EPOXY ESCN-195X and ESCN-2.20, which are manufactured by Sumitomo Chemical Co., Ltd., and A.E.R. ECN-235 and ECN-299, which are manufactured by Asahi Chemical Industry Co., Ltd., (all of the above are trade names); biphenol novolac-type epoxy resins such as NC-3000 and NC-3100, which are manufactured by Nippon Kayaku Co., Ltd.; bisphenol F-type epoxy resins such as EPICLON 830 manufactured by DIC Corporation, jER807 manufactured by Mitsubishi Chemical Corporation, and EPOTOHTO YDF-170, YDF-175 and YDF-2004, which are manufactured by Tohto Kasei Co., Ltd. (all of the above are trade names); hydrogenated bisphenol A-type epoxy resins such as EPOTOHTO ST-2004, ST-2007 and ST-3000 (trade names), which are manufactured by Tohto Kasei Co., Ltd.; glycidyl amine-type epoxy resins such as jER604 manufactured by Mitsubishi Chemical Corporation, EPOTOHTO YH-434 manufactured by Tohto Kasei Co., Ltd., and SUMI-EPOXY ELM-120 manufactured by Sumitomo Chemical Co., Ltd. (all of the above are trade names); hydantoin-type epoxy resins; alicyclic epoxy resins such as CELLOXIDE 2021 (trade name) manufactured by Daicel Chemical Industries, Ltd.; trihydroxyphenylmethane-type epoxy resins such as YL-933 manufactured by Mitsubishi Chemical Corporation, and T.E.N., EPPN-501 and EPPN-502, which are manufactured by The Dow Chemical Company (all of the above are trade names); bixylenol-type or biphenol-type epoxy resins and mixtures thereof, such as YL-6056, YX-4000 and YL-6121 (all of which are trade names) manufactured by Mitsubishi Chemical Corporation; bisphenal S-type epoxy resins such as EBPS-200 manufactured by Nippon Kayaku Co., Ltd., EPX-30 manufactured by ADEKA Corporation and EXA-1514 (trade name) manufactured by DIC Corporation; bisphenol A novolac-type epoxy resins such as jER157S (trade name) manufactured by Mitsubishi Chemical Corporation; tetraphenylolethane-type epoxy resins such as jERYL-931 (trade name) manufactured by Mitsubishi Chemical Corporation; heterocyclic epoxy resins such as TEPIC (trade name) manufactured by Nissan Chemical Industries, Ltd.; diglycidyl phthalate resins such as BLEMMER DGT manufactured by NOF Corporation; tetraglycidyl xylenoylethane resins such as ZX-1063 manufactured by Tohto Kasei Co., Ltd.; naphthalene group-containing epoxy resins such as ESN-190 and ESN-360, which are manufactured by Nippon Steel Chemical Co., Ltd., and HP-4032, EXA-4750 and EXA-4700, which are manufactured by DIC Corporation; epoxy resins having a dicyclopentadiene skeleton, such as HP-7200 and HP-7200H manufactured by DIC Corporation; glycidyl methacrylate copolymer-based epoxy resins such as CP-50S and CP-50M manufactured by NOF Corporation; cyclohexylmaleimide-glycidyl methacrylate copolymer epoxy resins; epoxy-modified polybutadiene rubber derivatives (for example, PB-3600 manufactured by Daicel Chemical Industries, Ltd.); and CTBN-modified epoxy resins (for example, YR-102 and YR-450 manufactured by Tohto Kasei Co., Ltd.). These epoxy resins may be used individually, or two or more thereof may be used in combination. Thereamong, novolac-type epoxy resins, bixylenol-type epoxy resins, biphenol-type epoxy resins, biphenol novolac-type epoxy resins, naphthalene-type epoxy resins and mixtures thereof are particularly preferred.

Examples of the polyfunctional oxetane compounds include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl) methyl acrylate, (3-ethyl-3-oxetanyl)methyl acrylate, (3-methyl-3-oxetanyl)methyl methacrylate, (3-ethyl-3-oxetanyl)methyl methacrylate, and oligomers and copolymers thereof; and etherification products of an oxetane alcohol and a hydroxyl group-containing resin such as a novolac resin, poly(p-hydroxystyrene), cardo-type bisphenol, calix-arenes, calixresorcinarenes or silsesquioxane. Other examples include copolymers of an oxetane ring-containing unsaturated monomer(s) and an alkyl(meth)acrylate.

Examples of the compounds having a cyclic thioether groups in one molecule include a bisphenol A-type episulfide resin, YL7000 manufactured by Mitsubishi Chemical Corporation. Further, for example, an episulfide resin prepared by the same synthesis method, in which an oxygen atom of an epoxy group of a novolac-type epoxy resin is substituted with a sulfur atom, can also be used.

Examples of the amino resins such as melamine derivatives and benzoguanamine derivatives include methylol melamine compounds, methylol benzoguanamine compounds, methylol glycoluril compounds and methylol urea compounds. Further, alkoxymethylated melamine compounds, alkoxymethylated benzoguanamine compounds, alkoxymethylated glycoluril compounds and alkoxymethylated urea compounds can be obtained by converting the methylol group of the respective methylol melamine compounds, methylol benzoguanamine compounds, methylol glycoluril compounds and methylol urea compounds into an alkoxymethyl group. The type of this alkoxymethyl group is not particularly restricted and it may be, for example, a methoxymethyl group, an ethoxymethyl group, a propoxymethyl group or a butoxymethyl group. Particularly, human- and environment-friendly melamine derivatives having a formal in concentration of 0.2% or less are preferred.

Examples of commercial products of these compounds include CYMEL 300, 301, 303, 370, 325, 327, 701, 266, 267, 238, 1141, 272, 202, 1156, 1158, 1123, 1170, 1174, UFR65 and 300 (all of which are manufactured by Mitsui Cyanamid Co., Ltd.); and NIKALAC Mx-750, Mx-032, Mx-270, Mx-280, Mx-290, Mx-706, Mx-708, Mx-40, Mx-31, Ms-11, Mw-30, Mw-30HM, Mw-390, Mw-100LM and Mw-750LM (all of which are manufactured by Sanwa Chemical Co., Ltd.). These thermosetting components may be used individually, or two or more thereof may be used in combination.

An isocyanate compound and a block isocyanate compound are compounds having a plurality of isocyanate groups or blocked isocyanate groups in one molecule. Examples of such a compound having a plurality of isocyanate groups or blocked isocyanate groups in one molecule include polyisocyanate compounds and blocked isocyanate compounds. The term "blocked isocyanate group" used herein refers to an isocyanate group that is protected and thus temporarily inactivated by a reaction with a blocking agent. When heated to a prescribed temperature, the blocking agent dissociates to yield an isocyanate group. It has been confirmed that, by adding the above-described polyisocyanate compound or blocked isocyanate compound, the curability of the curable composition and the toughness of the resulting cured product are improved.

As such a polyisocyanate compound, for example, an aromatic polyisocyanate, an aliphatic polyisocyanate or an alicyclic polyisocyanate can be used.

Specific examples of the aromatic polyisocyanate include 4,4'-diphenylmethane diisocyanate, 2,4-tolylene diisocyanate, 2,6-tolylene diisocyanate, naphthalene-1,5-diisocyanate, o-xylylene diisocyanate, m-xylylene diisocyanate and 2,4-tolylene dimer.

Specific examples of the aliphatic polyisocyanate include tetramethylene diisocyanate, hexamethylene diisocyanate, methylene diisocyanate, trimethylhexamethylene diisocyanate, 4,4-methylenebis(cyclohexylisocyanate) and isophorone diisocyanate.

Specific examples of the alicyclic polyisocyanate include bicycloheptane triisocyanate as well as adducts, biurets and isocyanurates of the above-mentioned isocyanate compounds.

As the blocked isocyanate compound, a product of addition reaction between an isocyanate compound and an isocyanate blocking agent can be used. Examples of an isocyanate compound that can react with a blocking agent include the above-described polyisocyanate compounds.

Examples of the isocyanate blocking agent include phenolic blocking agents such as phenol, cresol, xylenol, chlorophenol and ethylphenol; lactam-based blocking agents such as ε-caprolactam, δ-valerolactam, γ-butyrolactam and β-propiolactarn; activated methylene-based blocking agents such as ethyl acetoacetate and acetylacetone, alcohol-based blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate and ethyl lactate; oxime-based blocking agents such as formaldehyde oxime, acetaldoxime, acetoxime, methylethyl ketoxime, diacetyl monooxime and cyclohexane oxime; mercaptan-based blocking agents such as butylmercaptan, hexylmercaptan, t-butylmercaptan, thiophenol, methylthiophenol and ethylthiophenol; acid amid-based blocking agents such as acetic acid amide and benzamide; imide-based blocking agents such as succinic acid imide and maleic acid imide; amine-based blocking agents such as xylidine, aniline, butylamine and dibutylamine; imidazole-based blocking agents such as imidazole and 2-ethylimidazole; and imine-based blocking agents such as methyleneimine and proplyeneimine.

The blocked isocyanate compound may also be a commercially available one and examples thereof include SUMIDUR BL-3175, BL-4165, BL-1100 and BL-1265, DESMODUR TPLS-2957, TPLS-2062. TPLS-2078 and TPLS-2117 and DESMOTHERM 2170 and 2265 (all of which are manufactured by Sumitomo Bayer Urethane Co., Ltd.); CORONATE 2512, CORONATE 2513 and CORONATE 2520 (all of which are manufactured by Nippon Polyurethane Industry Co., Ltd.); B-830, B-815, B-846, B-870, B-874 and B-882 (all of which are manufactured by Mitsui Takeda Chemicals Inc.); and TPA-B80E, 17B-60PX and E402-B80T (all of which are manufactured by Asahi Kasei Chemicals Corporation). It is noted here that SUMIDUR BL-3175 and BL-4265 are produced using methylethyl oxime as a blocking agent. The above-described compounds having a plurality of isocyanate groups or blocked isocyanate groups in one molecule may be used individually, or two or more thereof may be used in combination.

It is preferred that such a thermosetting component be incorporated in an amount of 1 to 30 parts by mass with respect to 100 parts by mass of the curable composition of the present invention. When the amount of the thermosetting component is 1 part by mass or greater, a coating film having sufficient toughness and heat resistance can be obtained. Meanwhile, when the amount is 30 parts by mass or less, a reduction in the storage stability can be inhibited.

In the curable composition for a printed circuit board according to the present invention, in addition to the above-described components, as required, known and commonly used additives, for example, a surface tension-adjusting agent; a surfactant; a matting agent; a polyester-based resin for adjusting the film physical properties; a polyurethane-based resin; a vinyl-based resin; an acrylic resin; a rubber-based resin; a wax; a known and commonly used coloring agent such as phthalocyanine blue, phthalocyanine green, iodine green, disazo yellow, crystal violet, titanium oxide, carbon black or naphthalene black; at least one of antifoaming agents and leveling agents such as silicone-based, fluorine-based or polymer-based one; and adhesiveness-imparting agent such as an imidazole-based, thiazole-based or triazole-based silane-coupling agent, may also be incorporated.

Further, in the curable composition for a printed circuit board according to the present invention, in addition to the above-described components, a resin may also be incorporated in such an amount that does not adversely affect the properties of the curable composition. As the resin, any resin that is known and commonly used can be used; however, a (meth)acrylate compound having a polyene skeleton is preferred. The polyene skeleton is preferably formed by polymerization of, for example, either or both of polybutadiene and isoprene. It is particularly preferred that the polyene skeleton be constituted by repeating units represented by the Formula (I):

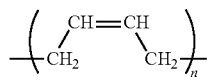
(I)

(wherein, n represents 10 to 300).

Because of the olefinic double bond of such repeating unit, the resulting curable resist composition for a printed circuit board is imparted with flexibility and an increased conformability to a substrate, so that good adhesiveness is attained.

In the polyene skeleton of the (meth)acrylate compound, the content of the repeating unit represented by the Formula (I) is preferably not less than 50%, more preferably not less than 80%.

Further, the polyene skeleton of the (meth)acrylate compound may also contain a unit represented by the following Formula (II):

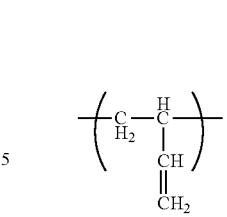
(II)

Specifically, for example, the following materials can be preferably used. That is, a liquid polybutadiene urethane (meth)acrylate obtained by urethane addition reaction of 2-hydroxyethyl(meth)acrylate with a hydroxyl group of a liquid polybutadiene via 2,4-tolylene diisocyanate; a liquid polybutadiene acrylate obtained by esterification reaction between a maleic anhydride-added maleated polybutadiene and 2-hydroxyacrylate; a liquid polybutadiene (meth)acrylate obtained by epoxy-esterification reaction between a carboxyl group of a maleated polybutadiene and glycidyl (meth)acrylate; a liquid polybutadiene (meth)acrylate obtained by esterification reaction between an epoxidized polybutadiene, which is produced by allowing an epoxidizing agent to react with a liquid polybutadiene, and (meth)acrylic acid; a liquid polybutadiene (meth)acrylate obtained by dechlorination reaction between a hydroxyl group-containing liquid polybutadiene and (meth)acrylic acid chloride; and a liquid hydrogenated 1,2-polybutadiene (meth) acrylate obtained by modification of liquid hydrogenated 1,2-polybutadiene glycol, in which unsaturated double bonds of a liquid polybutadiene having a hydroxyl group at both molecular terminals is hydrogenated, with urethane (meth)acrylate, can be preferably used.

Examples of commercial products thereof include NISSO PB TE-2000, NISSO PB TEA-1000, NISSO PB TE-3000 and NISSO PB TEAI-1000 (all of which are manufactured by Nippon Soda Co., Ltd.); CN301, CN303 and CN307 (all of which are manufactured by SARTOMER); BAC-15 (manufactured by Osaka Organic Chemical Industry Ltd.); BAC-45 (manufactured by Osaka Organic Chemical Industry Ltd.); and EY RESIN BR-45UAS (manufactured by Light Chemical Industries Co., Ltd.).

These (meth)acrylates having to polyene skeleton may be used individually, or a plurality thereof may be used in combination.

Further, in the curable composition for a printed circuit board according to the present invention, a diluent may be incorporated for the purpose of adjusting the viscosity of the composition.

Examples of the diluent include dilution solvents, photo-reactive diluents and heat-reactive diluents. Among these diluents, photo-reactive diluents are preferred.

Examples of the photo-reactive diluents include compounds having an unsaturated double bond, an oxetanyl group and/or an epoxy group, such as (meth)acrylates, vinyl ethers, ethylene derivatives, styrene, chloromethylstyrene, α-methylstyrene, maleic anhydride, dicydopentadiene, N-vinylpyrrolidone, N-vinylformamide, xylylene dioxetane, oxetane alcohol, 3-ethyl-3-(phenoxymethyl)oxetane and resorcinol diglycidyl ether.

Thereamong, (meth)acrylates are preferred and monofunctional (meth)acrylates are more preferred. Examples of the monofunctional (meth)acrylates include (meth)acrylates such as methyl(meth)acrylate, ethyl(meth)acrylate, butyl (meth)acrylate, isobutyl(meth)acrylate, lauryl(meth)acrylate, stearyl(meth)acrylate, 2-hydroxyethyl(meth)acrylate, hydroxypropyl(meth)acrylate, hydroxybutyl(meth)acrylate and glycidyl methacrylate; and acryloyl morpholine.

The amount of such diluent to be incorporated is preferably 1 to 30 parts by mass in 100 parts by mass of the curable composition of the present invention.

Further, in the curable composition for a printed circuit board according to the present invention, a tri- or higher functional (meth)acrylate compound (with no hydroxyl group) may be incorporated for the purpose of improving the tackiness of the composition after UV-curing.

Examples of the tri- or higher functional (meth)acrylate compound include polyfunctional acrylates represented by trimethylolpropane triacrylate, trait triacrylate, ethylene oxide-modified trimethylolpropane triacrylate, propylene oxide-modified trimethylolpropane triacrylate, epichlorohydrin-modified trimethylolpropane triacrylate, pentaerythritol tetraacrylate, tetramethylolmethane tetraacrylate, ethylene oxide-modified phosphoric acid triacrylate, propylene oxide-modified phosphoric acid triacrylate, epichlorohydrin-modified glycerol triacrylate, dipentaerythritol hexaacrylate, ditrimethylolpropane tetraacrylate and silsesquioxane modification products of these acrylates; methacrylate monomers corresponding to these acrylates; and ε-caprolactone-modified trisacryloxyethyl isocyanurate. The amount of such tri- or higher functional (meth)acrylate compound to be incorporated is preferably 1 to 40 parts by mass in 100 parts by mass of the curable composition of the present invention.

The curable composition for a printed circuit board according to the present invention which comprises the above-described components can be applied to printing methods such as screen printing method, ink-jet method, dip coating method, flow coating method, roll coating method, bar coater method and curtain coating method. Particularly, in cases where the curable composition for a printed circuit board according to the present invention is applied to an ink-jet method, the viscosity thereof at 50° C. is preferably 5 to 50 mPa·s, more preferably 5 to 20 mPa·s. This enables to perform printing smoothly without applying unnecessary burden on an ink-jet printer.

In the present invention, the viscosity is measured at normal temperature (25° C.) or 50° C. in accordance with JIS K2283. As long as the viscosity is 150 mPa·s or less at normal temperature or 5 to 50 mPa·s at 50° C., the curable composition can be printed by an ink-jet printing method.

In cases where the curable composition for a printed circuit board according to the present invention which has the above-described constitution is applied as an ink for ink-jet method, the composition can be printed on a flexible wiring board by a roll-to-roll process. In this case, by installing the below-described light source for photoirradiation in the downstream of an ink-jet printer, a pattern-cured coating film can be formed quickly.

The photoirradiation can be performed with ultraviolet radiation or an active energy ray; however, it is preferably performed with ultraviolet radiation. As the light source for this photoirradiation, for example, a low-pressure mercury lamp, a medium-pressure mercury lamp, a high-pressure mercury lamp, an ultrahigh-pressure mercury lamp, a xenon lamp or a metal halide lamp is appropriate. In addition, electron beams, α-ray, β-ray, γ-ray. X-ray, neutron beams and the like can also be used.

Further, after the photoirradiation, as required, the curable composition is cured by heating. Here, the heating temperature is, for example, 80 to 200° C. By performing the heating in this temperature range, the curable composition can be sufficiently cured. The heating time is, for example, 10 to 100 minutes.

Moreover, the curable composition for a printed circuit board according to the present invention is capable of forming a pattern-cured coating film which exhibits excellent adhesion to a printed circuit board that comprises a plastic substrate containing polyimide or the like as a main component and a conductor circuit arranged thereon, as well as excellent properties in terms of solder heat resistance, chemical resistance, solvent resistance, pencil hardness, resistance to electroless gold plating, bending characteristics and the like.

EXAMPLES

The present invention will now be described Concretely by way of examples thereof; however, the present invention is not restricted thereto by any means. It is noted here that, unless otherwise specified, "part(s)" means "part(s) by mass" in the followings.

Examples 1 to 4 and Comparative Examples 1 to 3

The components shown in Table 1 were blended and pre-mixed at the respective ratios (unit: parts) shown in Table 1 using a stirrer to prepare a curable composition for a printed circuit board.

For each of the thus obtained curable compositions and coating films thereof, the following properties were evaluated.

1. Viscosity at 50° C.

For each of the curable compositions obtained in Examples 1 to 4 and Comparative Examples 1 to 3, the viscosity at 50° C. and 100 rpm was measured using a cone plate-type viscometer (TVH-33H, manufactured by Toki Sangyo Co., Ltd.).

Evaluation Criteria
  ○: 20 mPa·s or less
  Δ: higher than 20 mPa·s but 50 mPa·s or less
  ×: higher than 50 mPa·s 2. Dryness to Touch after Curing with UV The curable compositions obtained in Examples 1 to 4 and Comparative Examples 1 to 3 were each coated on a copper-clad laminate using a 30 μm applicator (manufactured by Erichsen GmbH & Co. KG) and subsequently cured using a high-pressure mercury lamp (HMW-713, manufactured by ORC Manufacturing Co., Ltd.) at 150 mJ/cm². For each of the thus obtained samples, the dryness to touch was evaluated.
  ○: The sample was tack-free.
  ×: The sample was tacky.

3. Adhesion with Polyimide

The compositions obtained in Examples 1 to 4 and Comparative Example 1 to 3 were each coated on a polyimide substrate (UPI LEX 25S) using a 30 μm applicator (manufactured by Erichsen GmbH & Co. KG) and subsequently cured using a high-pressure mercury lamp (HMW-713, manufactured by OMC Manufacturing Co., Ltd) at 150 mJ/cm². Thereafter, in a 150° C. hot air circulation-type drying oven, the thus cured composition was heat-treated for 60 minutes. The thus prepared sample was subjected to a cross-cut tape peeling test (JIS K5600).
  ○: No detachment was observed.
  ×: Detachment was observed.
The test results are shown in Table 2.

4. Adhesion with Copper

The compositions obtained in Examples 1 to 4 and Comparative Example 1 to 3 were each coated on a copper foil (brand name is described below) using a 30 μm applicator (manufactured by Erichsen GmbH & Co. KG) and subsequently cured using a high-pressure mercury lamp (HMW-713, manufactured by ORC Manufacturing Co., Ltd.) at 150 mJ/cm². Thereafter, in a 150° C. hot air circulation-type drying oven, the thus cured composition was heat-treated for 60 minutes. The thus prepared sample was subjected to a cross-cut tape peeling test.
  ○: No detachment was observed.
  ×: Detachment was observed.
The test results are shown in Table 2.

5. Pencil Hardness (Surface Hardness)

For each of the cured coating films obtained in the above 4., the pencil hardness of the surface was measured in accordance with JIS K5600-5-4.

6. Bending Resistance

A flexible copper-clad laminate constituted by a 25 µm-thick polyimide film and a comb-shaped copper wiring (wiring pattern) formed by a 12 µm-thick copper foil was prepared (110 mm in length, 60 mm in width, copper wire width/space between copper wires=200 µm/200 µm). On this flexible copper-clad laminate substrate, each curable composition was coated to a film thickness of 15 µm by ink-jet printing using a piezo-type ink-jet printer. Here, immediately after the printing, the primed composition was pre-cured with UV using a high-pressure mercury lamp mounted on the ink-jet head. Then, the resultant was heat-cured at 150° C. for 1 hour to obtain a test piece. Using an MIT (Massachusetts Institute of Technology) tester, the thus cured test piece was repeatedly bent under the below-described conditions with its protective film facing inside, and the number of cycles at which electrical conduction was no longer observed was determined. For each evaluation, three test pieces were tested and the average number of cycles at which electrical conduction was no longer observed was calculated. The test conditions and evaluation criteria were as follows.

MIT Resistance Test Conditions

Load: 500 gf

Angle: opposing angle of 135°

Rate: 175 times/minute

Tip: R0.38-mm cylinder

Evaluation Criteria

○: 50 cycles or more

×: less than 50 cycles

7. Solvent Resistance

The cured coating films obtained in the above 4. were immersed in acetone for 30 minutes and the condition of each coating film was visually observed and evaluated based on the following criteria.

Evaluation Criteria

○: Absolutely no change was observed.

×: Swelling or detachment of the coating film was observed.

8. Chemical Resistance

The cured coating films obtained in the above 4. were immersed in 5-wt % aqueous sulfuric acid solution for 10 minutes and the condition of each coating film was visually observed and evaluated based on the following criteria.

Evaluation Criteria

○: Absolutely no change was observed.

×: Swelling or detachment of the coating film was observed.

9. Solder Heat Resistance

In accordance with the method of JIS C-5012, the cured coating films obtained in the above 4. were immersed in a 260° C. solder bath for 10 seconds and then each subjected to a peeling test using a cellophane adhesive tape. Thereafter, the condition of each coating film was visually observed and evaluated based on the following criteria.

Evaluation Criteria

○: The coating film showed no change.

Δ: The coating film showed some changes.

×: The coating film was detached.

10. Resistance to Electroless Gold Plating

Using a commercially available electroless nickel plating bath and electroless gold plating bath, the cured coating films obtained in the above 4. were each plated to a nickel thickness of 0.5 µm and a gold thickness of 0.03 µm. Then, the surface condition of each cured coating film was visually observed. The evaluation criteria were as follows.

Evaluation Criteria

○: Absolutely no change was observed.

×: Prominent whitening or clouding was observed.

TABLE 1

|  | Example 1 | Example 2 | Example 3 | Example 4 | Comparative Example 1 | Comparative Example 2 | Comparative Example 3 |
|---|---|---|---|---|---|---|---|
| Bifunctional acrylate monomer[*1] | 35 | 35 | 35 | 35 | 35 | 35 | 35 |
| Hydroxyl group-containing acrylate monomer[*2] | 45 | 45 | 45 | 45 | 45 | 45 | 45 |
| Trifunctional acrylate monomer[*3] | 10 | 10 | 10 | 10 | 10 | 10 | 10 |
| Trifunctional methacrylate monomer[*4] | 2.5 | 2.5 | 2.5 | 2.5 | 2.5 | 2.5 | 2.5 |
| Initiator[*5] | 1 | 1 | 1 | 1 | 1 | 1 | 1 |
| Initiator[*6] | 2 | 2 | 2 | 2 | 2 | 2 | 2 |
| Initiator[*7] | 2 | 2 | 2 | 2 | 2 | 2 | 2 |
| Thermosetting component[*8] | 10 | 10 | 10 | 10 | 10 | 10 | 10 |
| Surface tension-adjusting agent[*9] | 0.1 | 0.1 | 0.1 | 0.1 | 0.1 | 0.1 | 0.1 |
| Block copolymer[*10] | 3 | 10 | 30 |  |  |  |  |
| Block copolymer[*11] |  |  |  | 10 |  |  |  |
| Polymethyl methacrylate[*12] |  |  |  |  | 10 |  |  |
| Poly-n-butyl acrylate[*13] |  |  |  |  |  | 10 |  |
| Σ | 110.60 | 117.60 | 137.60 | 107.60 | 107.60 | 107.60 | 107.60 |
| Amount of block copolymer | 2.71% | 8.50% | 21.80% | 9.29% | 9.29% | 9.29% | 0.00% |

The product names and abbreviations used in Table 1 are as follows.

[*1]DPGDA; dipropylene glycol diacrylate (manufactured by BASF Japan Ltd.)

[*2]4HBA; 4-hydroxybutyl acrylate (manufactured by Nippon Kasei Chemical Co., Ltd.)

[*3]LAROMER LR8863; EO-modified trimethylolpropane triacrylate (manufactured by BASF Japan Ltd.)

[*4]EBECRYL 168 (manufactured by Daicel-Allnex Ltd.)

[*5]DAROCUR 1173; 2-hydroxy-2-methyl-1-phenyl-propane-1-one (manufactured by BASF Japan Ltd.)

[*6]2-ethylAQ; 2-ethylanthraquinone (manufactured by BASF Japan Ltd.)

[*7]IRGACURE 819; bis(2,4,6-trimethylbenzoyl)-phenylphosphine oxide (manufactured by BASF Japan Ltd.)

[*8]BI7982; block isocyanate (manufactured by Baxenden Chemicals Ltd.)

[*9]BYK-307; silicon-based additive (manufactured by BYK Chemie Japan)

[*10]KURARITY LA1114; X-Y-X type block copolymer (liquid) (manufactured by Kuraray Co., Ltd.)

[*11]NANOSTRENGTH M52N; X-Y-X type block copolymer (solid) (manufactured by Arkema K.K.)

[*12]BR-87 (manufactured by Mitsubishi Rayon Co., Ltd.)

[*13]AS-3000E (manufactured by Negami Chemical Industrial Co., Ltd.)

TABLE 2

|  | Example 1 | Example 2 | Example 3 | Example 4 | Comparative Example 1 | Comparative Example 2 | Comparative Example 3 |
|---|---|---|---|---|---|---|---|
| Viscosity | o | o | o | Δ | Δ | o | o |
| Dryness to touch after curing with UV | o | o | o | o | o | x | o |
| Adhesion with polyimide | o | o | o | o | x | o | x |
| Adhesion with copper | o | o | o | o | x | o | x |
| Pencil hardness | H | H | H | H | H | HB | HB |
| Bending resistance | o | o | o | o | x | o | x |
| Solvent resistance | o | o | o | o | x | o | x |
| Chemical resistance | o | o | o | o | x | o | x |
| Solder heat resistance | o | o | o | o | x | x | x |
| Electroless gold plating resistance | o | o | o | o | x | x | x |

As shown in Table 2, the photocurable compositions for a printed circuit board according to the present invention that were obtained in Examples 1 to 4 yielded good results for all of the dryness to touch after curing with UV, adhesion with polyimide, adhesion with copper, pencil hardness, bending resistance, solvent resistance, chemical resistance, solder heat resistance and resistance to electroless gold plating.

On the other hand, in Comparative Examples 1 to 3 where the component A of the present invention was not used or a polymer or an elastomer was used in place of the component A, satisfactory performance could not be attained for at least one of the above-described properties.

The present invention is not restricted to the constitutions of the above-described embodiments and examples, and a variety of modifications can be made within the scope of the gist of the present invention.

INDUSTRIAL APPLICABILITY

As described above, the curable composition for a printed circuit board according to the present invention shows excellent adhesion to both a plastic substrate and a conductor circuit metal and is capable of forming a fine pattern that is excellent in various properties such as solder heat resistance, solvent resistance, chemical resistance, pencil hardness and resistance to electroless gold plating.

Further, in order to make a composition sprayable by an ink-jet method, the composition is required to have a low viscosity. In general, low-viscosity photocurable compositions are considered to be poor in terms of properties such as adhesiveness and heat resistance; however, the composition of the present invention can also be suitably used for forming a solder resist pattern on a printed circuit board by an ink-jet method even when the composition has a low viscosity. Therefore, the composition of the present invention can be applied not only to printed circuit board materials such as resist inks and marking inks, but also to applications such as UV-molded materials, materials for optical fabrication and 3D ink-jet materials.

The invention claimed is:

1. A curable composition for a printed circuit board, comprising:
    a block copolymer;
    a hydroxyl group-containing (meth)acrylate compound;
    a bifunctional (meth)acrylate compound comprising no hydroxyl group; and
    a photopolymerization initiator,
    wherein the curable composition has a viscosity of 5 to 50 mPa·s at 50° C. in the absence of a dilution solvent for adjusting the viscosity, the block copolymer is one of an X-Y-X block copolymer or an X-Y-X' block copolymer, where X and X' represent a polymer unit having a glass transition temperature Tg of 0° C. or higher, and Y represents a polymer unit having a glass transition temperature Tg of lower than 0° C., the block copolymer is in an amount of 1 to 30 parts by mass, the hydroxyl group-containing (meth)acrylate compound is in an amount of 5 to 50 parts by mass, the bifunctional (meth)acrylate compound is in an amount of 20 to 80 parts by mass, and the photopolymerization initiator is in an amount of 0.5 to 10 parts by mass with respect to 100 parts by mass of the curable composition.

2. The curable composition for a printed circuit board according to claim 1, wherein the block copolymer has a weight-average molecular weight Mw of 10,000 to 100,000 and a molecular weight distribution Mw/Mn of 3 or less.

3. The curable composition for a printed circuit board according to claim 1, wherein the block copolymer is the X-Y-X block copolymer.

4. The curable composition for a printed circuit board according to claim 3, wherein Y comprises poly-n-butyl (meth)acrylate and X comprises polymethyl (meth)acrylate.

5. The curable composition for a printed circuit board according to claim 1, wherein the block copolymer is liquid at a temperature of 20° C. or higher.

6. The curable composition for a printed circuit board according to claim 1, wherein the bifunctional (meth)acrylate compound is in an amount of 40 to 70 parts by mass with respect to 100 parts by mass of the curable composition.

7. The curable composition for a printed circuit board according to claim 1, wherein the bifunctional (meth)acrylate compound has a viscosity of 5 to 50 mPa·s at 25° C.

8. The curable composition for a printed circuit board according to claim 1, further comprising:
    a thermosetting component.

9. The curable composition for a printed circuit board according to claim 3, wherein the block copolymer has a weight-average molecular weight Mw (Mw) of 10,000 to 50,000 and a molecular weight distribution Mw/Mn (Mw/Mn) of 2.5 or less.

10. The curable composition for a printed circuit board according to claim 1, wherein the hydroxyl group-containing (meth)acrylate compound is in an amount of 10 to 30 parts by mass with respect to 100 parts by mass of the curable composition.

11. The curable composition for printed circuit board according to claim 2, wherein the bifunctional (meth)acrylate compound is in an amount of 40 to 70 parts by mass with respect to 100 parts by mass of the curable composition.

12. The curable composition for printed circuit board according to claim 2, wherein the hydroxyl group-containing (meth)acrylate compound is in an amount of 10 to 30 parts by mass with respect to 100 parts by mass.

13. The curable composition for a printed circuit board according to claim 1, wherein the block copolymer has a weight-average molecular weight Mw of 10,000 to 50,000 and a molecular weight distribution Mw/Mn of 2.5 or less.

14. The curable composition for a printed circuit board according to claim 2, further comprising:
a thermosetting component.

15. The curable composition for a printed circuit board according to claim 3, wherein the bifunctional (meth)acrylate compound is in an amount of 40 to 70 parts by mass with respect to 100 parts by mass of the curable composition.

16. The curable composition for a printed circuit board according to claim 6, wherein the bifunctional (meth)acrylate compound has a viscosity of 5 to 50 mPa·s at 25° C.

17. A method for forming a cured coating film, comprising: coating, onto a substrate and a conductor circuit formed on the substrate, the curable composition of claim 1; and photoirradiating the curable composition coated on the substrate and the conductor circuit.

18. A method for manufacturing a printed circuit board, comprising:
printing the curable composition for a printed circuit board of claim 1 on a substrate; and subsequently photoirradiating the printed curable composition such that a pattern-cured coating film is obtained.

19. A method for manufacturing a printed circuit board, comprising:
printing the curable composition for a printed circuit board of claim 1 on a substrate by an ink-jet printing method; and subsequently photoirradiating the printed curable composition such that a pattern-cured coating film is obtained.

* * * * *